United States Patent [19]

Somers et al.

[11] 4,410,396

[45] Oct. 18, 1983

[54] METAL STRIPPING COMPOSITION AND PROCESS

[75] Inventors: Gerardus A. Somers, Langenboom; Jan J. M. Hendriks, St. Oedenrode, both of Netherlands

[73] Assignee: Occidental Chemical Corporation, Warren, Mich.

[21] Appl. No.: 443,977

[22] Filed: Nov. 23, 1982

[30] Foreign Application Priority Data

Nov. 24, 1981 [GB] United Kingdom ............... 8135327

[51] Int. Cl.$^3$ .............................................. C23F 1/00
[52] U.S. Cl. ...................................... 156/664; 134/3; 156/656; 252/79.3; 252/79.4
[58] Field of Search .................. 134/3; 156/656, 664; 252/79.3, 79.4, 142

[56] References Cited

U.S. PATENT DOCUMENTS 4,306,933  12/1981  DaFonte ..................... 252/79.3 X

*Primary Examiner*—William A. Powell
*Attorney, Agent, or Firm*—Richard P. Mueller

[57] ABSTRACT

There is disclosed a chemical stripping solution suitable for removing tin and tin-lead alloys from metallized, e.g. copper coated, substrates so as to leave the said substrate reusable comprising an aqueous solution of hydrogen peroxide in an amount of 0.1 to 10 molar, ammonium bifluoride in an amount of 0.4 to 10 molar, an acid of a type and in an amount such as to maintain the pH of the solution at the surface being stripped below the value at which smut formation occurs whereby effective stripping is achieved in use, and a metal complexing compound in an amount of at least 0.005 molar, the said metal complexing compound comprising 8-hydroxyquinoline or an 8-hydroxyquinoline derivative or a substituted 8-hydroxyquinoline and wherein the molar ratio ammonium bifluoride to complexor is at least 125:1 and the molar ratio of hydrogen peroxide to complexor is at least 50:1.

20 Claims, No Drawings

METAL STRIPPING COMPOSITION AND PROCESS

This invention relates to an improved metal stripping composition and process and, more particularly, relates to an improved composition and process for stripping tin and tin-lead alloys, such as solders, from another metal substrate, such as a copper substrate.

BACKGROUND OF THE INVENTION

Solutions containing hydrogen peroxide have heretofore been proposed for use in various processes involving the dissolution of metals and metal oxides. Exemplary of these are processes involving pickling, etching, cleaning, chemical brightening or polishing, and the like. Typical disclosures of pickling solutions are found in G.B. Patent Application No. 2,014,552A directed to a solution of hydrogen peroxide and a mineral acid with a saccharin stabilizer and G.B. Pat. No. 1,499,918, and its equivalent U.S. Pat. No. 4,022,703, directed to a solution of hydrogen peroxide and sulfuric acid with an 8-hydroxyquinoline stabilizer. Typical disclosures of etching solutions are found in G.B. Pat. No. 1,474,294, directed to hydrogen peroxide in an aqueous fluoride solution with tetrazolium as an inhibitor, G.B. Pat. No. 1,295,954 directed to an alkaline solution of hydrogen peroxide containing a metal ion complexor and a stabilizer, and G.B. Pat. No. 962,335 directed to a solution of hydrogen peroxide and ammonium fluoride. A typical disclosure of a metal cleaner is found in G.B. Pat. No. 1,407,269 directed to the use of ferrous sulfate, hydrogen peroxide or nitric acid, sulfuric acid and a bifluoride. Typical disclosures of chemical brightening or polishing solutions are found in G.B. Pat. No. 1,209,016, directed to the use of hydrogen peroxide, ammonium bifluoride, oxalic acid and sulfamic acid and in G.B. Pat. No. 1,056,670 directed to the use of hydrogen peroxide and hydrofluoric acid.

In many of the above-mentioned disclosures, the need for a stabilizer for the hydrogen peroxide is recognized. In addition to the recognition in these patents, other disclosures have recognized the general need for stabilization of hydrogen peroxide solutions. Typical of these are French Pat. No. 998,486, directed to the use of oxyquinoline compounds, such as the sulfate, and U.S. Pat. No. 3,053,632, directed to the use of 2-alkyl substituted 8-hydroxyquinolines.

With the growth of the printed circuitboard industry in recent years, there has been an increasing need for compositions which will strip or remove solder from other metal substrates, such as copper. In the manufacture of printed circuitboards, tin or tin-lead solders are frequently applied to copper components of the circuitboard, such as the terminal tabs. It is then necessary to remove the solder from the copper substrate so that it can be plated with a more noble metal, such as gold. Additionally, there are frequent occurrences of mis-soldering which make it necessary to remove the improperly applied solder from the copper substrate in order to recover the copper plated printed circuit substrates for resoldering. In view of the high production rates for the printed circuitboards, rapid removal of the solder composition is essential. Such removal must, however, be accomplished without significant attack on the copper substrate.

Attempts to utilize the various hydrogen peroxide based metal treating compositions as described above to effect the solder stripping have, generally, not been successful. When used to strip tin and tin/lead alloy solders from copper substrates with these compositions, the stripping rates have been too slow and/or the attack on the copper substrates has been too great.

Accordingly, attempts have been made to develop hydrogen peroxide based solutions which are particularly adapted for solder stripping. In U.S. Pat. No. 3,841,905, for example, there is described a solder stripping composition of hydrogen peroxide and ammonium bifluoride. U.S. Pat. No. 3,926,699, which was reissued as Reissue No. 29181, describes a hydrogen peroxide and ammonium bifluoride solder stripping composition which contains, as a stabilizer, a combination of Dequest and triisopropanol amine. In G.B. Pat. No. 976,167, there is described a solder stripping composition of hydrogen peroxide and fluoboric acid. Another solder stripping composition is described in G.B. Patent Application No. 2,074,103A, which composition is made up of hydrogen peroxide, ammonium bifluoride, trichloroacidic acid and a polyacrylamide. In G.B. Pat. No. 1,446,816 or its equivalent U.S. Pat. No. 3,986,970, yet another solder stripper composition is described which is comprised of hydrogen peroxide, an acid, a source of fluoride ions and a stabilizer for the hydrogen peroxide. Among suitable stabilizers disclosed in the patent is 8-oxyquinoline. Although these compositions have been used with varying degrees of success, they have generally not been able to provide the high rates of solder stripping, without attack on the copper substrates, which are presently required in the manufacture of printed circuitboards.

It is, therefore, an object of the present invention to provide an improved solder stripping composition and process.

A further object of the present invention is to provide an improved solder stripping composition and process characterized by high solder stripping rates without significant attack on the metal substrate, such as copper.

These and other objects will become apparent to those skilled in the art from the description of the invention which follows.

SUMMARY OF THE INVENTION

Pursuant to the above objects, it has now been found that a solder stripping composition, having significantly increased stripping rates and reduced attack on the substrate, can be formulated with hydrogen peroxide, ammonium fluoride or bifluoride, an acid and an 8-hydroxyquinoline compound by utilizing these components in certain specific amounts while maintaining certain specific ratios of these components to each other. The improved solder stripping composition of the present invention is an aqueous solution containing hydrogen peroxide (Component A) in an amount of about 0.1 to about 10 molar, ammonium fluoride or ammonium bifluoride (Component B) in an amount of from about 0.4 to about 10 molar, an inorganic acid (Component C) in an amount at least sufficient to maintain the pH of the solution at the surface being stripped below the value at which smut formation occurs and, as a metal complexing compound, an 8-hydroxyquinoline compound (Component D) in an amount of at least about 0.005 molar. Additionally, in the composition of the present invention, the molar ratio of hydrogen ions to Component D is at least 100:1, and desirably the molar ratio of Component A to Component B is at most 1:1, e.g. at most 0.91:1. It is also desirable that the molar ratio of the ammonium fluoride or bifluoride (B) to the metal complexing compound (D) will be at least 125:1 and the molar ratio of the hydrogen peroxide (A) to the metal complexing compound (D) will be at least 50:1. When this composition is used, in either a spray or immersion process, and particularly, when it is used with sulfuric acid as a preferred acid in an amount sufficient to maintain the bath pH at a value which is not in excess of about 5.3 and is further used with a weight ratio of ammonium bifluoride or fluoride (calculated as ammonium bifluoride) to hydrogen peroxide which is in excess of about 1.25:1, very rapid stripping of tin and tin/lead solders from metal substrates, such as copper, is obtained without significant attack of the copper substrate.

DETAILED DESCRIPTION OF THE INVENTION

The invention aims to provide a chemical stripping solution with high capacity for tin and tin-lead alloys so that soldered copper substrates can be stripped under spray application conditions as well as immersion. It is also desired for such application conditions that the solution should have a high stripping rate. Hydrogen peroxide was chosen as the oxidizing agent because of its high solubility in water which provides the solution with high stripping capacity. High stripping rate is achieved by using hydrogen peroxide in combination with ammonium bifluoride or fluoride, with the bifluoride being preferred. However, this combination results in slight dissolution of the copper substrate occurring and the copper ions thus brought into solution in the stripping composition have a catalysing affect on the decomposition of the hydrogen peroxide. Tin and lead ions have little effect on the decomposition. Investigations have been made, therefore, to try to find a suitable stabilizing agent to prevent decomposition of the hydrogen peroxide or to find a complexing agent to complex the dissolved copper ions and prevent their catalytic effect on the decomposition of the hydrogen peroxide. Several chemical compounds were tried in a bath containing tin, lead and copper ions and 8-hydroxyquinoline was found to be an example of a class of compounds which inhibited the decomposition of hydrogen peroxide very effectively. It was found that in the presence of such compounds as 8-hydroxyquinoline, the copper ions were strongly complexed, particularly if the molar ratio of 8-hydroxyquinoline to copper was higher than one.

The resulting mixture of hydrogen peroxide, ammonium bifluoride and 8-hydroxyquinoline type compounds gave a suitably high stripping capacity for tin and tin-lead alloys and sufficiently good stripping rate but, unexpectedly, a green precipitate thought to be copper 8-hydroxyquinoline complex (copper oxinate) was formed and manifested itself as smut formation on the substrate. It was found that this complex was soluble below pH 5.3, and surprisingly, this problem of smut formation could thus be removed by increasing the acidity of the solution, as by the addition of sulfuric acid, while this increase in acidity did not increase the rate of stripping of copper form the copper plated printed circuitboard substrate.

Thus, according to the present invention, a chemical stripping solution suitable for removing tin and tin-lead alloys from metallized, e.g. copper coated, substrates so as to leave the said substrate reusable comprises an aqueous solution of hydrogen peroxide in an amount of 0.1 to 10 molar, ammonium bifluoride or fluoride in an amount of 0.4 to 10 molar, an acid to reduce the pH of the bath to below 5.3 and a metal, e.g. copper, complexing compound in an amount of at least 0.005 molar, the said metal complexing compound comprising 8-hydroxyquinoline or an 8-hydroxyquinoline derivative (as defined herein) or a substitute 8-hydroxyquinoline.

The hydrogen peroxide is preferably present in an amount of 1 to 6 molar, e.g. 2 to 5 molar. The ammonium bifluoride or fluoride is preferably present in an amount in excess of 0.5 molar, e.g. in the range of 2 to 7 or 3 to 6 molar. The acid is preferably present in the range 0.1 to 4 molar; for example, it may be sulfuric acid which, preferably, is used in the range 1 to 2 molar. The metal complexing compound is preferably used in the range up to 0.2 molar, e.g. in the range of 0.01 to 0.1 molar or more preferably 0.01 to 0.05 molar. A particularly preferred copper complexing agent is 8-hydroxyquinoline. Substituted quinoline in which the substitute is an alkyl or aryl group attached to one of the carbon atoms of the quinoline molecule are also effective.

References have been made above to stripping tin or solder from copper coated printed circuitboards for reuse but other stripping purposes besides this may find use of the present stripping composition advantageous. In particular, terminal tabs on printed circuitboards may become splashed or coated with solder and this may require to be stripped prior to coating of the terminal tabs with a noble metal such as gold to ensure that they provide effective contacts for the printed circuitboards in the electronic apparatus in which the circuitboards will be used. Here, if the noble metal plating is to be effective, it is highly desirable that no significant removal of copper occurs while complete removal or substantially complete removal of the tin or solder is achieved.

Ammonium bifluoride is the preferred commercially available source of hydrofluoric acid but other reactive compositions of ammonia with hydrofluoric acid or salts thereof, such as ammonium fluoride, have also proved effective and their use is equally contemplated within the scope of the present invention. It would appear that the hydrofluoric acid is the active component and the ammonia appears to have some inhibiting function on the hydrofluoric acid in reducing or preventing its attack on the copper. Such other ammonia/hydrofluoric acid salts or mixtures, in addition to ammonium fluoride, which may be used, include mixtures of ammonium halides with hydrofluoric acid.

The hydrogen peroxide is also merely an example of a convenient oxygen source satisfactory to support the reaction of the acid with the solder. While it is the preferred commercially available material, other suitable oxygen sources could be used and examples of these are tert-butyl hydroperoxide and sodium or ammonium perborate.

So far as the acid for reducing the pH is concerned, sulfuric acid is very convenient and is preferred but other effective acids would not be excluded. It is thought, however, that hydrochloric acid may possibly have a damaging attack on the copper substrate and it is thus prudent to avoid use of hydrochloric acid.

Various derivates of 8-hydroxyquinoline are also effective, including the neutral sulphate of 8-hydroxyquinoline $(C_9H_6NOH)_2H_2SO_4$ (also known as ortho hydroxyquinoline), the 8-hydroxyquinoline derivative of phthalysulphathiazole, 5-sulpho-6-methyl-8-oxyquinoline and 8-hydroxy-quinoline-salicylate.

These are the compounds included with the term an 8-hydroxyquinoline derivative (as defined herein).

Specifically preferred stripping compositions comprise 1 to 400, e.g. 10 to 200 or 50 to 180 especially 70 to 100 g/l of 100% hydrogen peroxide, at least 1, e.g. 2 to 30, especially 2.5 to 6 g/l of 8-hydroxyquinoline stabilizer, 5 to 350, e.g. 50 to 200, especially 80 to 170 g/l of sulfuric acid and 20 to 600, e.g. 200 to 400, especially 250 to 350 g/l of ammonium bifluoride.

In addition to using the components described above in amounts within the ranges which have been specified, it is also important that certain ratios of the various components to each other are also maintained in the stripping solutions. In this regard, the molar ratio of the ammonium bifluoride or fluoride compound to the metal complexor should be at least about 125:1 and preferably within the range of about 125 to about 265:1. Additionally, the molar ratio of the hydrogen peroxide oxidizing agent to the metal complexor should be at least about 50:1 and, preferably, is within the range or about 50 to about 115:1.

It has further been found that it is very desirable to maintain the weight ratio of ammonium bifluoride or ammonium fluoride (calculated as ammonium bifluoride) to 2-hydrogen peroxide in excess of about 1.25:1. Preferably, this weight ratio is at least about 1,5:1 and, most preferably, is from about 1.8 to about 5 (or even higher):1.

With respect to the sulfuric acid used in formulating the compositions of this invention, as has been noted hereinabove, the amount of sulfuric acid used is desirably sufficient to provide a bath pH which is below about 5.3 but which is not sufficiently low as to result in any significant increase in the attack of the solution on the copper substrate. Most preferably, the amount of sulfuric acid in the solution is from about 75 to about 185 g/l. Where the bath contains too little acid, the deposition of green copper oxinate and/or smut formation may occur, while excessive attack on the copper may result from using an excessive amount of acid.

In a most preferred embodiment, it has been found that weight ratios of the sulfuric acid to the metal complexor compound which are at least about 35:1 produce particularly advantageous results. Most preferably, the weight ratio of sulfuric acid to the metal complexor compound will be within the range of about 35 to about 95:1.

SPECIFIC EMBODIMENTS OF THE PRESENT INVENTION

The invention may be put into practice in various ways and a number of embodiments will be described to illustrate the invention with reference to the following specific examples.

EXAMPLE 1

A formulation for spray stripping of solder (60% tin/40% lead) from a copper layer on a fiberglass resin printed circuitboard substrate was made up as follows:

| INGREDIENT | COMPOSITION |
| --- | --- |
| Hydrogen Peroxide (100%) | 2.33 Mol (80 g/l) |
| Ammonium bifluoride | 5.25 Mol (300 g/l) |
| Sulfuric Acid | 1.4 Mol (138 g/l) |
| 8-hydroxyquinoline | 0.021 Mol (3.0 g/l) |
| Water | to 1 liter |

The ingredients for this composition were mixed together in the order given and a resin printed circuitboard carrying a copper layer 40 mincrons thick with a layer of solder 20 microns thick was contacted by spraying the above composition at a net rate of about 25 cc per square centimeter of solder-covered surface per minute at a temperature of 25° C. Net rate means the actual amount of liquids sprayed which contact the surface being stripped. The composition had a pH of 4.0. The solder was substantially removed within 1 minute with no significant attack and no measurable reduction of thickness of the copper layer. This rate of attack did not substantially diminish until 10 cc of solution had been used to strip 32 square centimeters of printed circuit board. Analysis of the stripping composition at this state, i.e. after stripping of 3200 square centimeters of printed circuit board by 1 liter of solution indicated that the bath contained 32 g/l of tin, 21 g/l of lead (of which the larger amount was precipitated as sulphate of fluoride) and ⅛ g/l of copper.

In accordance with the present invention, one has to make certain that the pH at the surface being stripped remains below that at which smut formation occurs (5.3 in the case of copper). Thus the presence of hydrogen peroxide in the stripping reaction causes the pH to tend to rise during stripping as compared with the pH of the bulk solution and therefore one needs to make certain that the initial pH of the bulk solution is at such level that in use the pH at the surface will not rise above the critical pH value. For copper it has been found that an initial pH of not more than 4.0 produces an effective system in which smut formation is avoided.

EXAMPLE 2

A bath similar to Example 1 was made up in the same way except that the hydrogen peroxide concentration was 1 Molar, sulfuric acid concentration 1 Molar, and the 8-hydroxyquinoline concentration 0.02 Molar. The bath was used under the same conditions as described for Example 1 and similar results were obtained.

EXAMPLE 3

A bath similar to Example 1 was made up in the same way except that the hydrogen peroxide concentration was 4.5 Molar (153 g/l), sulfuric acid concentration 2 Molar (164 g/l), the 8-hydroxyquinoline concentration 0.04 Molar (5.84 g/l) and the ammonium bifluoride concentration 5 Molar (285 g/l). The bath was used under the same conditions as described for Example 1 and similar results were obtained.

EXAMPLE 4

The pickling effect of a chemical stripping solution in accordance with the present invention were compared with a solution, similar to those disclosed in U.K. Patent Specification No. 1,499,918, made up as follows:

| Solution A | |
| --- | --- |
| Ingredient | Composition |
| Hydrogen Peroxide | 0.58 Mol (20 g/l) |
| Sulfuric Acid | 0.92 Mol (90 g/l) |

| Ingredient | Solution A Composition |
|---|---|
| 8-hydroxyquinoline | 0.0007 Mol (0.1 g/l) |
| Water | to 1 liter₂ |

A copper laminate printed circuitboard immersed in the solution of Example 1 for one minute was compared with an identical board immersed in Solution A for one minute. Moderate magnetic agitation was used in both cases. After this treatment the appearances of the two boards were similar in that the copper surfaces were clean and both were slightly etched/attacked/pickled. However, it was found that wereas Solution A removed copper at a rate of more than 0.9 um/min, the solution of Example 1 removed copper only at a rate of 0.09 um/min.

EXAMPLE 5

The solder stripping properties of a chemical stripping solution in accordance with the present invention was compared with Solution A as set out in Example 4, above. A resin printed circuitboard carrying a copper layer 40 microns thick with a layer of solder 20 microns thick was immersed in a quantity of Solution A. Under moderate magnetic agitation, no marked stripping of solder was observed. Secondly, a printed circuitboard was subjected to the spray treatment as described in Example 1 except that Solution A was used instead of the solution of Example 1. A stripping rate of 0.7 um/min was observed as compared to a stripping rate of 14 um/min when the solution of Example 1 was used.

To further illustrate the operation of the present invention, additional stripping solutions were formulated in accordance with Table I, below. As used in this table, ingredient A is $H_2O_2$, ingredient B (except as otherwise indicated) is $NH_4HF_2$, ingredient C is $H_2SO_4$, and ingredient D is 8-hydroxyquinoline.

TABLE I

| INGREDIENT G/L | A | B | C | D |
|---|---|---|---|---|
| 6 | 2 | 5* | 50 | 10 |
| 7 | 2 | 5 | 50 | 10 |
| 8 | 80 | 300 | 138 | 3 |
| 9 | 80 | 300* | 138 | 3 |
| 10 | 34 | 300 | 98 | 3 |
| 11 | 153 | 285 | 164 | 5.84 |
| 12 | 80 | 196** | 138 | 3 |
| 13 | 80 | 196** | 184 | 3 |

*NaF was substituted for $NH_4HF_2$
**$NH_4F$ was substituted for $NH_4HF_2$

In the foregoing examples, example 6 corresponds to Example 12 of G.B. Pat. No. 1,446,816. Additionally, a usable solution was not obtained in Example 9 because of the insolubility of the sodium fluoride at the level specified.

Each of the formulations of Examples 6 through 8 and 10 through 13 were tested for the rate of stripping 60/40 tin/lead solder, using boards as described in Example 5, by spraying as described in Example 1 and by immersion as described in Example 5. Additionally, these formulations were tested for attack on the copper substrate, using copper plated boards as described in Example 4, the test being carried out both by immersion, as in Example 4, and by spraying in which the test panel was oscillated through a 3 cm diameter cone of spray. Finally, the formulations of these examples were tested for redeposition of solder on the copper substrate after stripping, using both immersion and spraying, as in Example 5, but utilizing boards having a slightly thinner solder layer than those of Example 5. The results of these tests are set forth below in Table II for the spray testing and in Table III for the immersion testing.

TABLE II

| PROPERTY EXAMPLE | SOLDER STRIPPING RATE MICRONS/ MINUTE | COPPER ATTACK MICRONS/ MINUTE | APPEARANCE OF COPPER SURFACE (1) |
|---|---|---|---|
| 6 | 1.3 | 0.19 | A |
| 7 | 0.8 | 0.39 | A |
| 8 | 19.3 | 0.58 | B |
| 10 | 16.4 | 0.09 | B |
| 11 | 16.5 | 1.17 | B |

NOTES ON TABLE II
(1) A; GREY SMUT B; NO SMUT C; GREEN COPPER OXINATE

TABLE III

| PROPERTY EXAMPLE | SOLDER STRIPPING RATE MICRONS/ MINUTE | COPPER ATTACK MICRONS/ MINUTE | APPEARANCE OF COPPER SURFACE (1) |
|---|---|---|---|
| 6 | 0.62 | 0.035 | A |
| 7 | 0.62 | 0.10 | A |
| 8 | 11.4 | 1.579 | A |
| 10 | 10.0 | 0.33 | C |
| 11 | 12.9 | 1.43 | B |
| 12 | 11.1 | 1.09 | B C |
| 13 | 7.1 | 5.8 | B |

NOTES ON TABLE III
(1) A; GREY SMUT B; NO SMUT C; GREEN COPPER OXINATE

Additional stripping solutions were formulated in accordance with Example 8, above, with the exception that the amount of the ammonium bifluoride in the solution was varied. These solutions were then tested for the solder stripping rate and the copper attack by spraying in accordance with the procedures set forth hereinabove. The compositions of the formulations used and the results obtained are set forth in Table IV.

| PROPERTY EXAMPLE | AMOUNT OF $NH_4HF_2$ G/L | SOLDER STRIPPING RATE MICRONS/ MINUTE | COPPER ATTACK MICRONS/ MINUTE |
|---|---|---|---|
| 14 | 25 | 2.4 | 1.0 |
| 15 | 50 | 3.0 | 0.6 |
| 16 | 100 | 2.8 | 0.5 |
| 17 | 150 | 10.9 | 0.4 |
| 18 | 200 | 10.5 | 0.4 |
| 19 | 250 | 12.7 | 0.4 |
| 20 | 300 | 19.5 | 0.4 |
| 21 | 400 | 26.8 | 0.3 |

In none of the foregoing examples 14 through 21 was there any evidence of smut formation on the copper surface after stripping.

What is claimed is:

1. A chemical stripping composition suitable for removing tin and tin-lead alloys from a metallized substrate which is an aqueous solution comprising:
  A. hydrogen peroxide in an amount of from about 0.1 to about 10 molar,
  B. ammonium bifluoride or ammonium fluoride in an amount of from about 0.4 to about 10 molar,
  C. an acid in an amount such as to maintain the pH of the solution at the surface being stripped below the value at which smut formation occurs or compounds of the metal of the metallized surface and the metal complexing compound are deposited on the metallized surface, and D. a metal complexing compound which is an 8-hydroxyquinoline compound in an amount of at least 0.005 molar, and wherein the molar ratio of component B to component D is at least 125:1 and the molar ratio of component A to component D is at least 50:1.

2. The composition as claimed in claim 1 wherein component B is ammonium bifluoride, component C is sulfuric acid and component D is 8-hydroxyquinoline.

3. The composition as claimed in claim 2 wherein the molar ratio of component B to component D is from about 125-265:1 and the molar ratio of component A to component D is from bout 50-115:1.

4. The composition as claimed in claim 2 wherein the weight ratio of component B to component A is in excess of about 1.25:1.

5. The composition as claimed in claim 3 wherein the weight ratio of component B to component A is from about 1.8-5.0:1.

6. The composition as claimed in claim 4 wherein the weight ratio of component C to component D is in excess of about 35:1.

7. The composition as claimed in claim 5 wherein the weight ratio of component C to component D is from about 35-95:1.

8. The composition as claimed in claim 2 wherein component A is present in an amount from about 1 to about 6 molar, component B is present in an amount from about 2 to about 7 molar, component C is present in an amount from about 0.1 to about 4 molar, and component D is present in an amount from about 0.01 to about 0.1 molar.

9. The composition as claimed in claim 7 wherein component A is present in an amount from about 50 to about 180 g/l, component B is present in an amount from about 250 to about 350 g/l, component C is present in an amount from about 80 to about 170 g/l, and component D is present in an amount from about 2.5 to about 6 g/l.

10. A process for stripping tin and tin-lead alloy solders from a metallized substrate which comprises contacting the solder coated substrate with the composition of claim 1 for a period of time sufficient to remove substantially all of said solder without significant attack on said substrate.

11. The process as claimed in claim 10 wherein component B is ammonium bifluoride, component C is sulfuric acid and component D is 8-hydroxyquinoline.

12. The process as claimed in claim 11 wherein the molar ratio of component B to component D is from about 125-265:1 and the molar ratio of component A to component D is from about 50-115:1.

13. The process as claimed in claim 11 wherein the weight ratio of component B to component A is in excess of about 1.25:1.

14. The process as claimed in claim 12 wherein the weight ratio of component B to component A is from about 1.8-5.0:1.

15. The process as claimed in claim 13 wherein the weight ratio of component C to component D is in excess of about 35:1.

16. The process as claimed in claim 14 wherein the weight ratio of component C to component D is from about 35-95:1.

17. The process as claimed in claim 11 wherein component A is present in an amount of from about 1 to about 6 molar, component B is present in an amount of from about 2 to about 7 molar, component C is present in an amount from about 0.1 to about 4 molar, and component D is present in an amount from about 0.01 to about 0.1 molar.

18. The process as claimed in claim 16 wherein component A is present in an amount from about 50 to about 180 g/l, component B is present in an amount from about 250 to about 350 g/l, component C is present in an amount from about 80 to about 170 g/l, and component D is present in an amount from about 2.5 to about 6 g/l.

19. A chemical stripping composition suitable for removing tin and tin-lead alloys from a metallized substrate which is an aqueous solution comprising:

A. hydrogen peroxide in an amount of from about 0.1 to about 10 molar,

B. ammonium bifluoride or ammonium fluoride in an amount of from about 0.4 to about 10 molar, C. an acid in an amount such as to maintain the pH of the solution at the surface being stripped below the value at which smut formation occurs or compounds of the metal of the metallized surface and the metal complexing compound are deposited on the metallized surface, and D. a metal complexing compound which is an 8-hydroxyquinoline compound in an amount of at least 0.005 molar, and wherein the molar ratio of hydrogen ions to component D is at least 100:1.

20. The composition as claimed in claim 19 wherein the molar ratio of component A to Component B is at most 1:1.

* * * * *